US009653441B1

(12) United States Patent
Chen et al.

(10) Patent No.: US 9,653,441 B1
(45) Date of Patent: May 16, 2017

(54) MONOLITHIC INTEGRATION OF A III-V OPTOELECTRONIC DEVICE, A FILTER AND A DRIVING CIRCUIT (71) Applicant: International Business Machines Corporation, Armonk, NY (US)

(72) Inventors: Chia-Yu Chen, White Plains, NY (US); Li-Wen Hung, Mahopac, NY (US); Jui-Hsin Lai, White Plains, NY (US); Ko-Tao Lee, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/187,087

(22) Filed: Jun. 20, 2016

(51) Int. Cl.
*H01L 33/00* (2010.01)
*H01L 25/16* (2006.01)
*H01L 29/06* (2006.01)
*H01L 29/04* (2006.01)
*H01L 29/20* (2006.01)
*H01L 33/32* (2010.01)
*H01L 29/786* (2006.01)
*H01L 29/417* (2006.01)
*H01L 29/66* (2006.01)
(Continued)

(52) U.S. Cl.
CPC ............ *H01L 25/167* (2013.01); *H01L 25/50* (2013.01); *H01L 27/15* (2013.01); *H01L 29/045* (2013.01); *H01L 29/0649* (2013.01); *H01L 29/2003* (2013.01); *H01L 29/41733* (2013.01); *H01L 29/66742* (2013.01); *H01L 29/78681* (2013.01); *H01L 33/32* (2013.01)

(58) Field of Classification Search
None
See application file for complete search history.

(56) References Cited

U.S. PATENT DOCUMENTS 4,956,682 A * 9/1990 Ohnaka ............... H01L 27/15
257/198
6,583,689 B2   6/2003 Katohno
7,420,226 B2   9/2008 Augustine et al.
(Continued)

FOREIGN PATENT DOCUMENTS

EP          0 809 229 A2    11/1997

OTHER PUBLICATIONS

Lai, C. et al., "Anisotropy of Light Extraction Emission with High Polarization Ratio from GaN-based Photonic Crystal Light-emitting Diodes", Recent Optical and Photonic Technologies, INTECH, Jan. 2010, pp. 53-72.
(Continued)

*Primary Examiner* — Benjamin Sandvik
(74) *Attorney, Agent, or Firm* — Scully, Scott, Murphy & Presser, P.C.; Louis J. Percello, Esq.

(57) ABSTRACT

After forming an opening extending through a (100) silicon layer and a buried insulator layer and into a (111) silicon layer of a semiconductor-on-insulator (SOI) substrate, a light-emitting element is formed within the opening. A portion of the (111) silicon layer located beneath the light-emitting element is patterned to form a patterned structure for tuning light emission characteristics and enhancing efficiency of the light-emitting element. Next, at least one field effect transistor (FET) is formed on the (100) silicon layer for driving the light-emitting element.

20 Claims, 5 Drawing Sheets

(51) Int. Cl.
*H01L 25/00* (2006.01)
*H01L 27/15* (2006.01)

(56) References Cited

U.S. PATENT DOCUMENTS

| | | |
|---|---|---|
| 8,212,294 B2 | 7/2012 | Hoke et al. |
| 8,354,678 B1 * | 1/2013 | Fox .................... H01L 27/1463 |
| | | 257/287 |
| 8,823,146 B1 | 9/2014 | Hoke |
| 9,362,444 B1 * | 6/2016 | Leobandung ......... H01L 31/184 |
| 9,450,381 B1 * | 9/2016 | Cai ........................ G02B 6/122 |
| 2008/0197362 A1 * | 8/2008 | Hisamoto ................ G02B 6/13 |
| | | 257/86 |
| 2011/0073875 A1 * | 3/2011 | Griebenow ........ G02B 6/12004 |
| | | 257/84 |

OTHER PUBLICATIONS http://www.mouser.com/new/Power-Integrations/powerintRDK-271/, "Power Integrations RDK271 4.5W Power Factor Corrected LED Driver Reference Design Kit" printed Jun. 9, 2016.

* cited by examiner

MONOLITHIC INTEGRATION OF A III-V OPTOELECTRONIC DEVICE, A FILTER AND A DRIVING CIRCUIT

BACKGROUND

The present application relates to semiconductor device fabrication, and more particularly to the monolithic integration of light-emitting elements, optical components and integrated driving circuits on a single chip.

Semiconductor optoelectronic devices such as light-emitting diodes (LEDs) and laser diodes are used in a wide range of applications, such as telecommunication, display, solid-state lighting, sensing, surveillance and imaging. LEDs or laser diodes are often integrated with optical components such as Bragg grating filters or nano-mirrors to optimize the frequency of emitted light or to enhance efficiency. Meanwhile, complementary metal oxide semiconductor (CMOS) integrated circuits formed on a silicon substrate having a (100) crystallographic surface orientation are also needed for driving the LEDs or the laser diodes. Conventionally, all three components are put together by chip bonding, which is time consuming. Therefore, a simple process that allows monolithic integration of optoelectronic devices, optical components and driving circuits remains needed.

SUMMARY

The present application provides a method of monolithically integrating a light-emitting element, an optical component and an integrated driving circuit on a single chip. After forming an opening extending through a (100) silicon layer and a buried insulator layer and into a (111) silicon layer of a semiconductor-on-insulator (SOI) substrate, a light-emitting element is formed within the opening. A portion of the (111) silicon layer located beneath the light-emitting element is patterned to form a patterned structure for tuning light emission characteristics and enhancing efficiency of the light-emitting element. Next, at least one field effect transistor (FET), which can be a p-type FET, an n-type FET or a pair of complementary p-type and n-type FET is formed on the (100) silicon layer for driving the light-emitting element.

According to an aspect of the present application, a semiconductor structure is provided. The semiconductor structure includes a semiconductor-on-insulator (SOI) substrate including, from bottom to top, a (111) silicon layer, a buried insulator layer and a (100) silicon layer, a field effect transistor (FET) located on a portion of the (100) silicon layer, and a light-emitting element separated from the FET and embedded in the SOI substrate. The light-emitting element is laterally surrounded by the (100) silicon layer, the buried insulator layer and an upper portion of the (111) silicon layer. The semiconductor structure further includes a patterned portion of the (111) silicon layer located beneath the light-emitting element. The patterned portion of the (111) silicon layer includes trenches exposing portions of a bottommost surface of the light-emitting element.

According to another aspect of the present application, a method of forming a semiconductor structure is provided. The method includes forming an opening extending through a (100) silicon layer, a buried insulator layer and into an upper portion of a (110) silicon layer of a semiconductor-on-insulator (SOI) substrate. A light-emitting element is then formed within the opening. The light-emitting element has a topmost surface coplanar with a top surface of the (100) silicon layer. After patterning a portion of the (111) silicon layer located beneath the light-emitting element, a field effect transistor (FET) is formed in a region of the (100) silicon layer.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
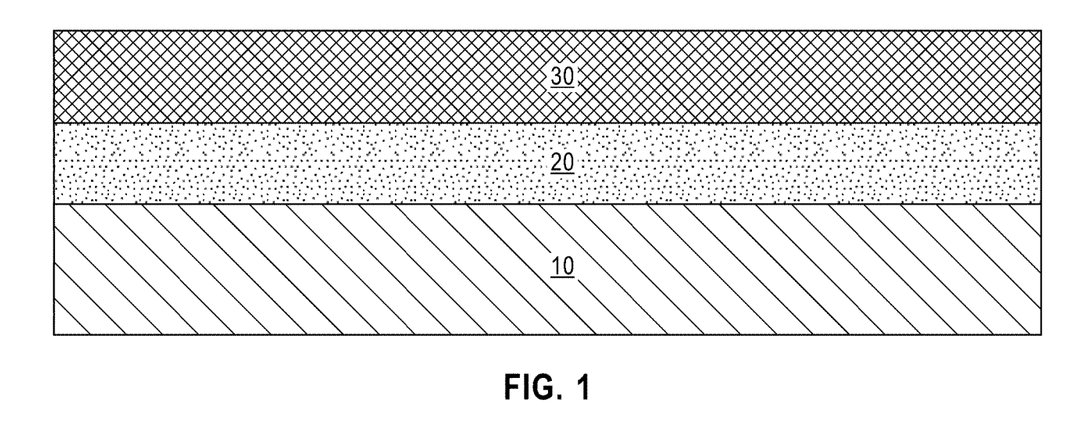
FIG. 1 is a cross-sectional view of an exemplary semiconductor structure after providing a semiconductor-on-insulator (SOI) substrate that includes, from bottom to top, a (111) silicon layer, a buried insulator layer and a (100) silicon layer according to an embodiment of the present application.

Referring to FIG. 1, an exemplary semiconductor structure according to an embodiment of the present application includes a semiconductor-on-insulator (SOI) substrate. The SOI substrate includes, from bottom to top, a silicon layer having a (111) crystallographic surface orientation (herein referred to as (111) silicon layer 10), a buried insulator layer 20, and a silicon layer having a (100) crystallographic surface orientation (herein referred to as (100) silicon layer 30). The buried insulator layer 12 isolates the (100) silicon layer 30 from the (111) silicon layer 10.

The (111) silicon layer 10 and the (100) silicon layer 30 can both be single crystalline. Moreover, the (100) silicon layer 30, over which FETs are formed, can be doped, undoped or contain regions that are doped and other regions that are non-doped. The dopant may be an n-type dopant selected from an Element from Group VA of the Periodic Table of Elements (i.e., P, As and/or Sb) or a p-type dopant selected from an Element from Group IIIA of the Periodic Table of Elements (i.e., B, Al, Ga and/or In). The (100) silicon layer 30 may contain one region that is doped with a p-type dopant and another region that is doped with an n-type dopant. The thickness of the (111) silicon layer 30 can be from 600 nm to 2 μm, although lesser and greater thicknesses can also employed. The thickness of the (100) silicon layer 10 can be from 40 nm to 100 nm, although lesser and greater thicknesses can also be employed.

The buried insulator layer 20 may include a dielectric material such as silicon dioxide, silicon nitride, silicon oxynitride, boron nitride or a combination thereof. The thickness of the buried insulator layer 20 can be from 50 nm to 200 nm, although lesser or greater thicknesses can also be employed.

The SOI substrate (10, 20, 30) shown in FIG. 1 can be formed utilizing any conventional bonding process. For example and in one embodiment, the (100) silicon layer can be can be bonded to a structure comprising the (111) silicon layer 10 and the buried insulator layer 20.

Figure 2:
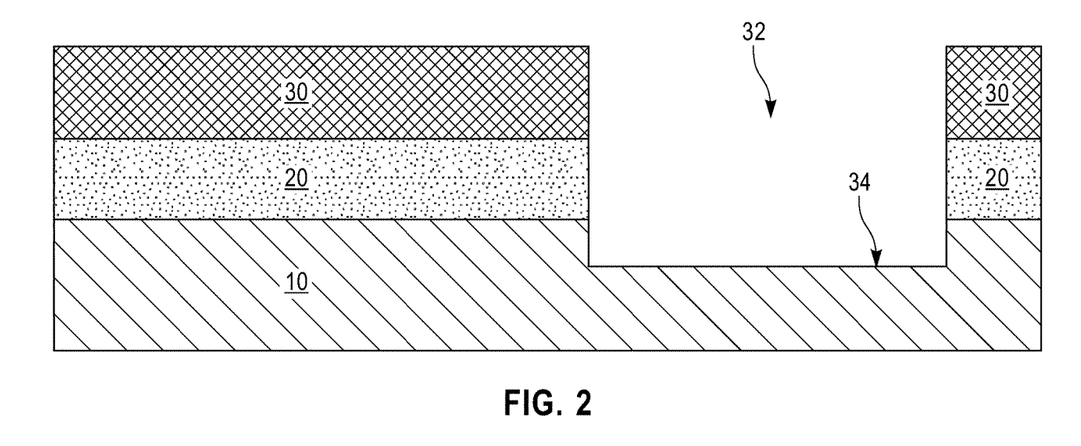
FIG. 2 is a cross-sectional view of the exemplary semiconductor structure of FIG. 1 after forming an opening through the (100) silicon layer and the buried insulator layer and into the (111) silicon layer.

Referring to FIG. 2, an opening 32 is formed extending through the (100) silicon layer 30, the buried insulator layer 20 and partially into the (111) silicon layer 10. The opening 32 exposes a sub-surface 34 of the (1111) silicon layer 10 which is located beneath the top surface of the (111) silicon layer 10. By "sub-surface" it is meant a surface of a material that is located between a topmost surface and a bottommost surface of the same material.

The opening 32 can be formed by lithography and etching. Specifically, a blanket layer of a photoresist material is first applied on the topmost surface of the SOI substrate (10, 20, 30) (i.e., the top surface of the (100) silicon layer 30) and lithographically patterned to form an opening therein. The pattern of the opening in the photoresist layer is then transferred into the SOI substrate (10, 20, 30) by an anisotropic etch to form the opening 32. In some embodiments, the anisotropic etch can be a dry etch such as, for example, reactive ion etch (RIE). In other embodiments, the anisotropic etch may be a wet etch. After the etching process has been performed, the patterned photoresist layer can be removed from the structure utilizing a conventional resist stripping process such as, for example, ashing.

Figure 3:
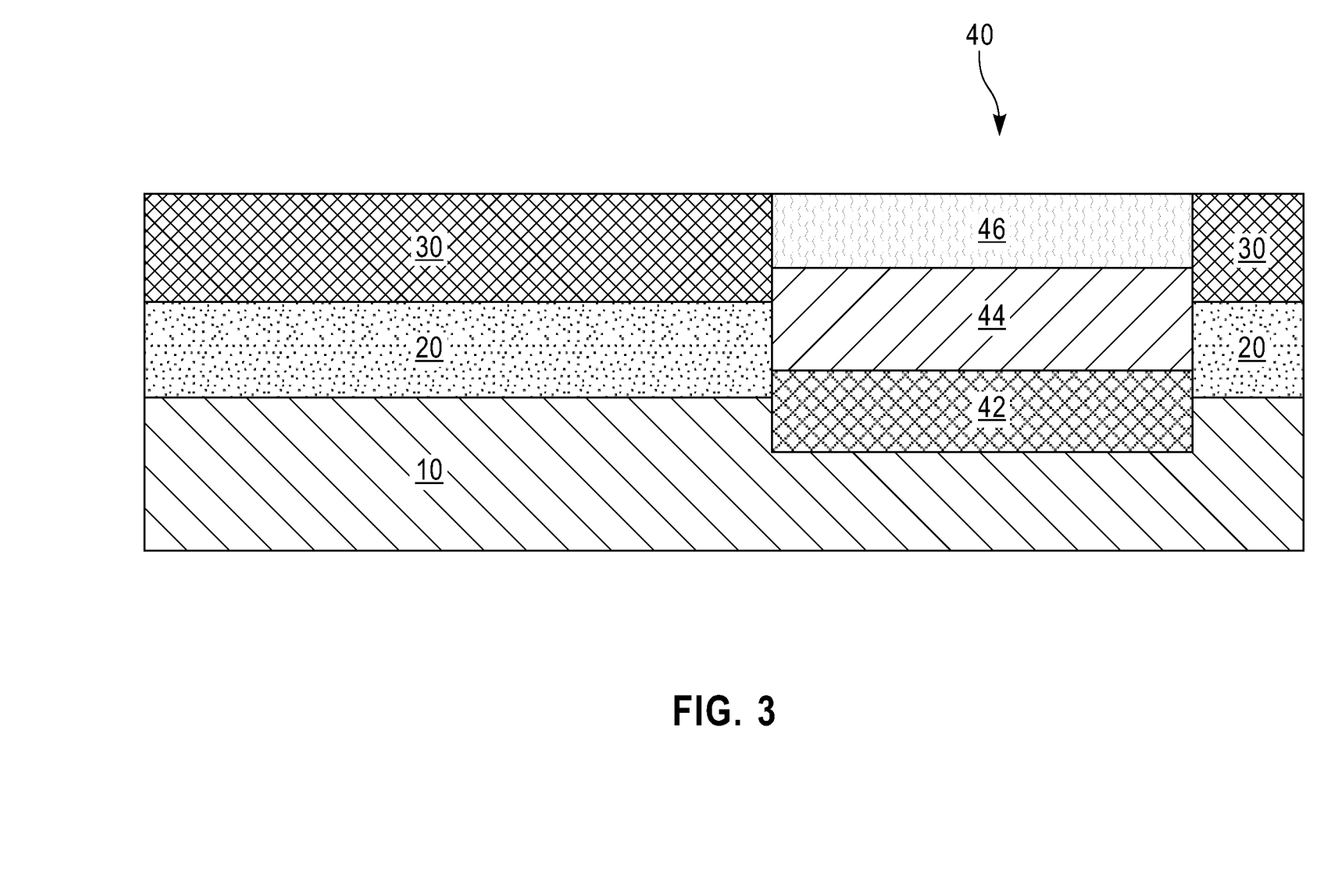
FIG. 3 is a cross-sectional view of the exemplary semiconductor structure of FIG. 2 after forming a light-emitting element within the opening.

Referring to FIG. 3, a light-emitting element 40 is formed within the opening 32. The light-emitting element 40 can be a LED or a laser diode. In one embodiment and as shown in FIG. 3, the light-emitting element 40 is a LED including, from a bottom to top, a first contact layer 42, a light-emitting layer 44 and a second contact layer 46. The topmost surface of the light-emitting element 40 (i.e., the top surface of the second contact layer 46) is coplanar with the top surface of the (100) silicon layer 30.

The first contact layer 42 may include an n-doped III-V compound semiconductor material such as, for example, GaN or AN. The n-type dopants can include, but are not limited to, Si. In one embodiment, the first contact layer 42 is composed of Si-doped GaN. The doping concentration can be from $1\times10^{16}$ atoms/cm$^3$ to $1\times10^{20}$ atoms/cm$^3$, although lesser and greater doping concentrations can also be employed. The thickness of the first contact layer 42 can be from 100 nm to 500 nm, although lesser and greater thicknesses can also be employed.

The light-emitting layer 44 may include a multiple quantum well (MQW) composed of alternating layers of a first III-V compound semiconductor material and a second III-V compound semiconductor material having a bandgap narrower than the first III-V compound semiconductor material. The wider bandgap material serves as the quantum barrier, while the narrower bandgap material acts as the quantum well. The composition and the thickness of the first and second III-V compound semiconductor materials are selected depending on the target emitting wavelength of the light-emitting element 40. In one embodiment, the light-emitting layer 44 includes alternating layers of GaN and AlGaN or alternating layers of GaN and InGaN. Other materials may also be employed. A thickness of each layer of the first and the second III-V compound semiconductor materials can be from 1 nm to 10 nm, although lesser and greater thicknesses can also be employed. The total thickness of the light-emitting layer 44 can be from 100 nm to 200 nm, although lesser and greater thicknesses can also be employed.

The second contact layer 46 may include a p-doped III-V compound semiconductor material such as, for example, GaN or AN. The p-type dopants can include, but are not limited to, Mg and Zn. In one embodiment, the second contact layer 46 is composed of Mg-doped GaN. The doping concentration can be from $1\times10^{16}$ atoms/cm$^3$ to $1\times10^{20}$ atoms/cm$^3$, although lesser and greater doping concentrations can also be employed. The thickness of the second contact layer 46 can be from 100 nm to 500 nm, although lesser and greater thicknesses can also be employed.

The first contact layer 42, the light-emitting layer 44, and the second contact layer 46 can be single crystalline, and can be formed utilizing a selective epitaxy growth (or deposition) process such as, for example, molecular beam epitaxy (MBE) or metal-organic chemical vapor deposition (MOCVD). "Epitaxy growth and/or deposition" mean the growth of a semiconductor material on a deposition surface of a semiconductor material, in which the semiconductor material being grown has the same crystalline characteristics as the semiconductor material of the deposition surface. During the selective epitaxy growth, the III-V compound semiconductor material only grows from (111) surfaces, such as the sub-surface 34 of the (111) silicon layer 10 that is exposed by the opening 32 and the underlying layer (i.e., the first contact layer 42 and the light-emitting layer 44) having a (111) crystallographic surface orientation, but not on the (100) surface of the (100) silicon layer 30 and dielectric surface of the buried insulator layer 20. The first contact layer 42, the light-emitting layer 44, and the second contact layer 46 thus formed have a (111) crystallographic surface orientation which is the same as the crystallographic surface orientation of the (111) silicon layer 10.

The dopants in the first and the second contact layers 42, 46 may be introduced with in-situ doping during the selective epitaxy growth. Thus, the first contact layer 42 and the second contact layer 46 are formed as doped semiconductor material portions. Alternatively, the first and the second contact layers 42, 46 can be formed by ex-situ doping. In this case, the first and the second contact layers 42, 46 are formed as intrinsic semiconductor portions and n-type or p-type dopants are subsequently introduced into first and the second contact layers 42, 46 to convert the intrinsic semiconductor material portions into doped semiconductor material portions.

Figure 4:
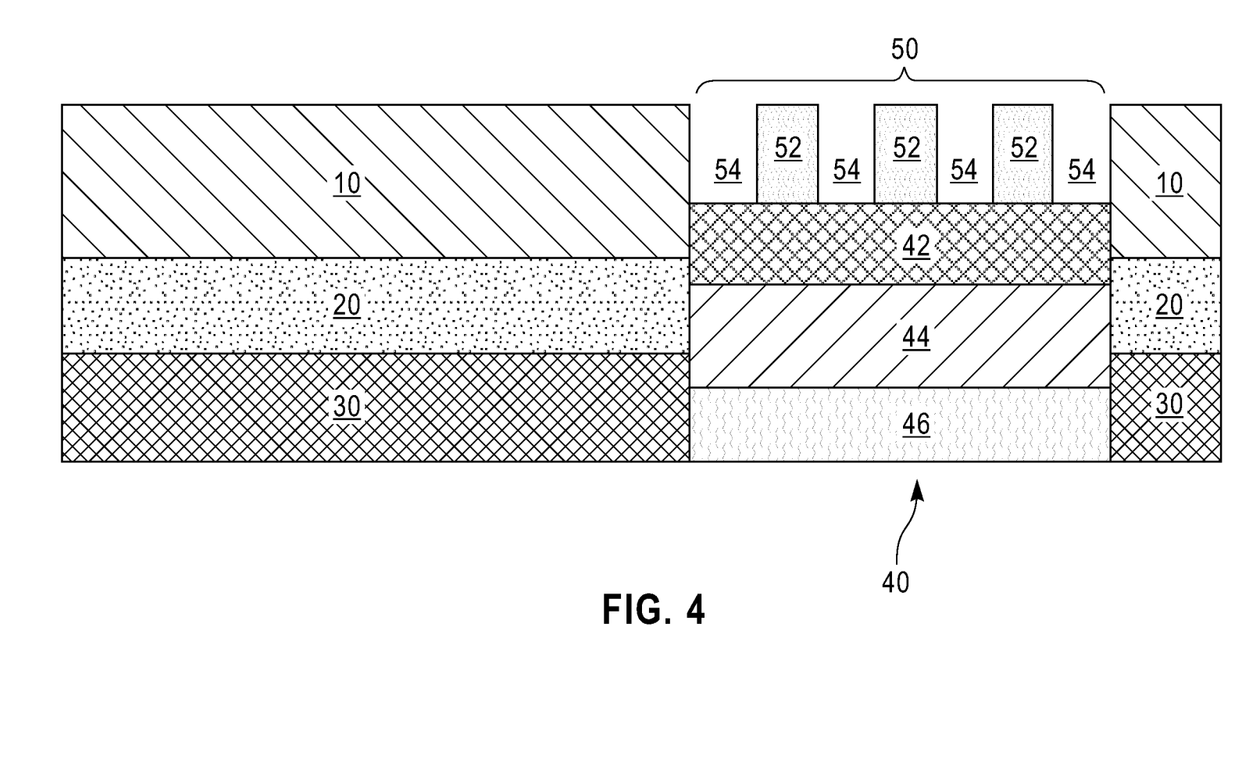
FIG. 4 is a cross-sectional view of the exemplary semiconductor structure of FIG. 3 after patterning a portion of the (111) silicon layer located beneath the light-emitting element to form a patterned structure.

Referring to FIG. 4, the structure of FIG. 3 is flipped upside down, and a portion of the (111) silicon layer 10 that was originally located beneath the light-emitting element 40 is patterned to form a patterned structure 50 comprising features 52 and trenches 54 separating the features 52 from one another. The trenches 54 expose portions of the light-emitting element 40 from the backside (i.e., the light-emitting side). The patterned structure 50 is configured to tune light emission characteristics and enhance efficiency of the light-emitting element 40. For example, the patterned structure 50 can be used to increase an intensity of the light passing through, or to impose a phase-shift on the emitted light. In one embodiment, the patterned structure 50 acts as an optical filter.

The patterned structure 50 can be formed by lithography and etching processes. Specifically, a photoresist layer can be first applied over the bottom surface of the (111) silicon layer 10. The photoresist layer is then patterned to form a pattern of openings therein. The pattern in the photoresist layer is transferred into the (111) silicon layer 10 by an anisotropic etch. The anisotropic etch can be a dry etch such as, for example, RIE, or a wet etch that removes silicon of the (111) silicon layer 10 selective to the III-V compound semiconductor material that provides the first contact layer 42. The features 52 in the pattern can have a width ranging from 1 µm to 5 µm, although lesser and greater widths can also be employed. The spacing between the features 52 (i.e., the width of trenches 54) can be from 500 nm to 1 µm, although lesser and greater spacing can also be employed. After formation of the patterned structure 50, the patterned photoresist layer can be removed from the structure, for example by ashing.

Figure 5:
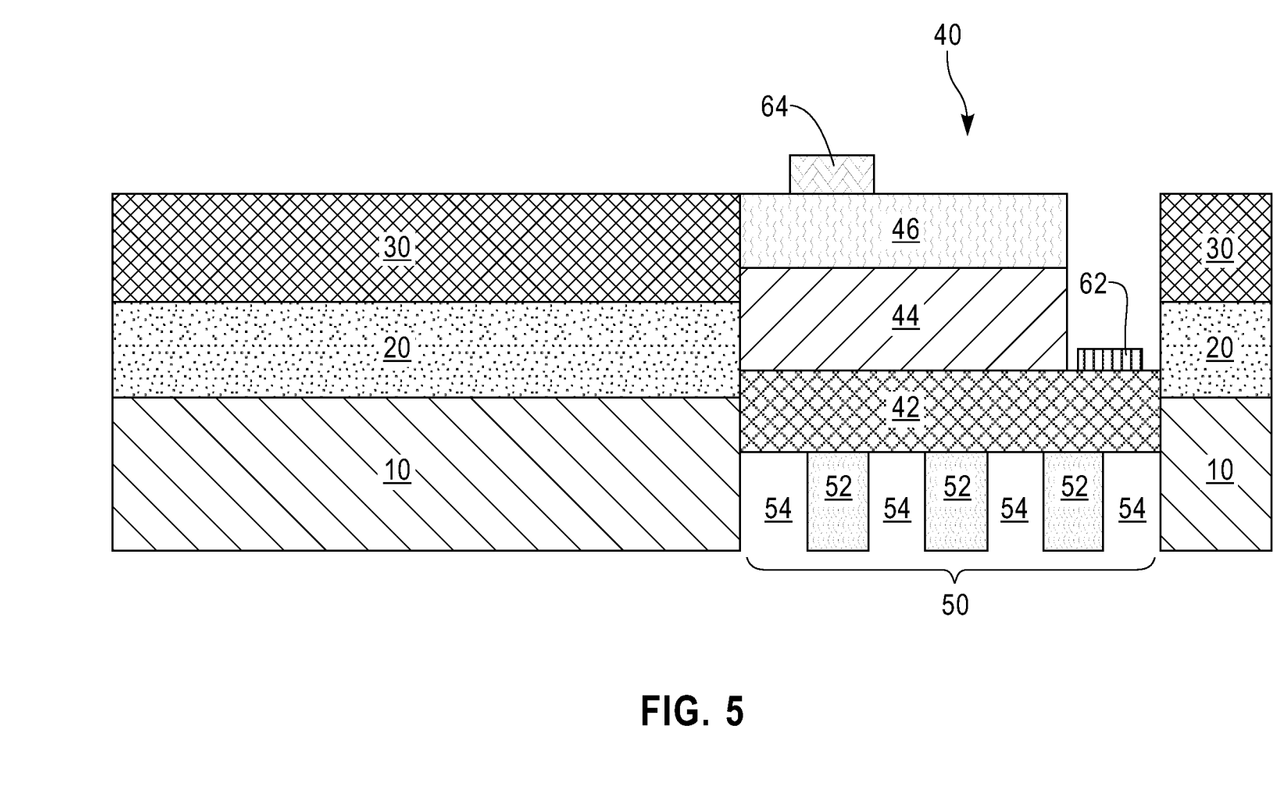
FIG. 5 is a cross-sectional view of the exemplary semiconductor structure of FIG. 4 after forming a first contact structure contacting a first contact layer in the light-emitting element and a second contact structure contacting a second contact layer in the light-emitting element.

Referring to FIG. 5, the structure of FIG. 4 is flipped over so that the (100) silicon layer 30 is at the top of the structure. Subsequently, contact structures including a first contact structure 62 contacting the first contact layer 42 and a second contact structure 64 contacting the second contact layer 46 are formed by metallization processes. The first contact structure 62 includes a first metal that forms ohmic contact with the first contact layer 42. Exemplary first metals include, but are not limited to, Al, Cu, or Ti/Au. The second contact structure 64 includes a second metal that forms ohmic contact with the second contact layer 46. Exemplary second metals include, but are not limited to, Pt/Ni/Au, Au/Ge/Ni, Al, or Cu. The first and second metals can be deposited by a directional deposition method which can be a vacuum evaporation or a collimated physical vapor deposition. When forming the first contact structure 62, the second contact layer 46 and the light-emitting layer 44 are first patterned to expose an end portion of the first contact layer 42 and the first metal is deposited on the exposed portion of the first contact layer 42 to provide the first contact structure 62.

Figure 6:
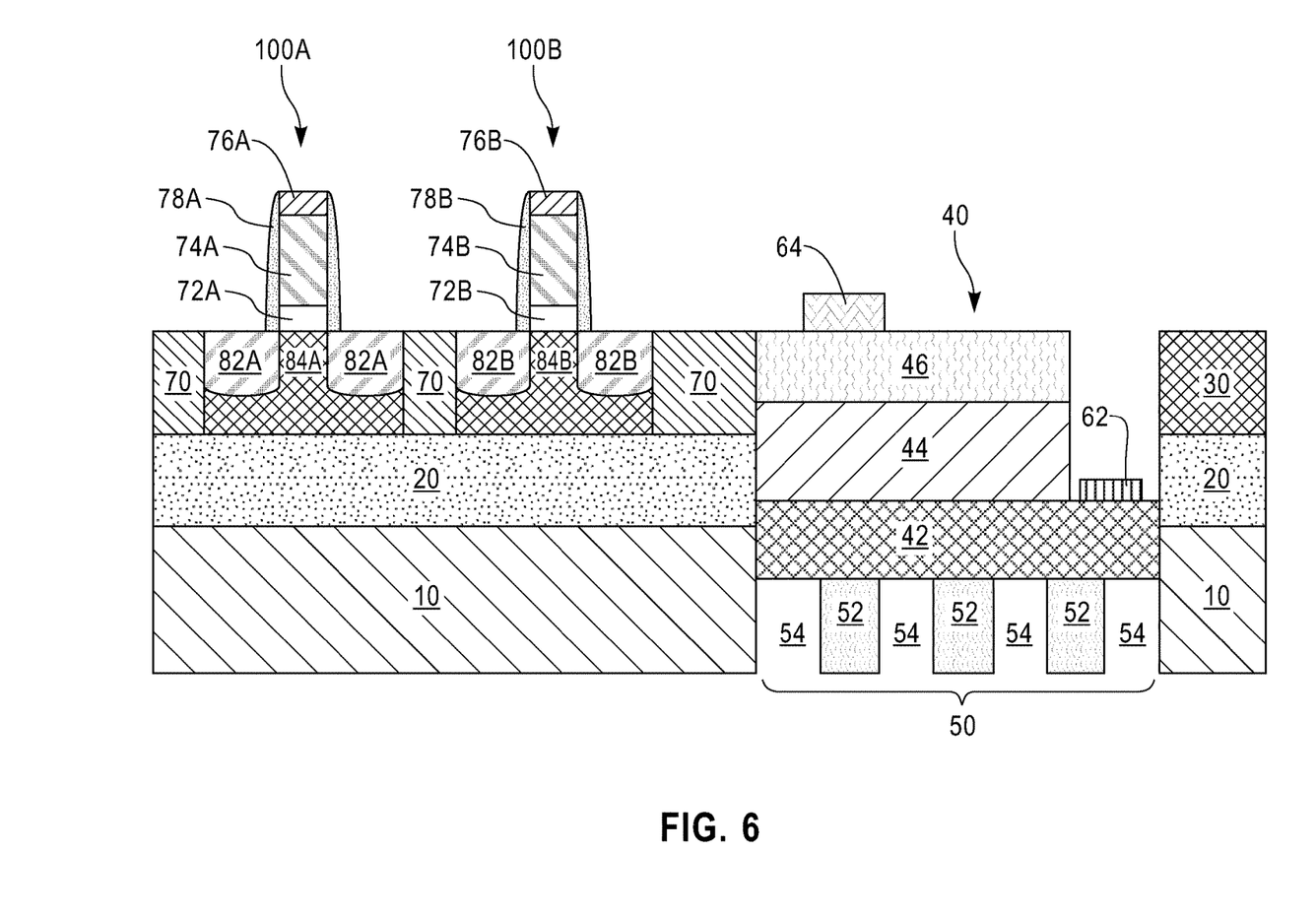
FIG. 6 is a cross-sectional view of the exemplary semiconductor structure of FIG. 5 after forming at least one FET on the (100) silicon layer.

Referring to FIG. 6, at least one field effect transistor (FET) is formed in a device region of the (100) silicon layer 30. The at least one FET can be a p-type FET, an n-type FET, or a pair of complementary p-type FET and n-type FET. In one embodiment and as shown in FIG. 5, a pair of complementary FETs including a p-type FET 100A located in a p-type device region and an n-type FET 100B located in an n-type device region is formed. The various devices regions are defined by isolation regions 70.

The isolation regions 70 may include any dielectric material, such as oxides, nitrides or oxynitrides. For example, the isolation regions 70 may be composed of silicon dioxide or silicon nitride. The isolation regions 70 may be formed through the (100) silicon layer 30 and may be in contact with the top surface of the buried insulator layer 20. In one embodiment, the isolation regions 70 are formed by forming trenches in the (100) silicon layer 30 and filling the trenches with a dielectric material.

The p-type FET 100A and n-type FET 100B can be fabricated using conventional CMOS processes known in the art. For example, gate stacks including a first gate stack of a first gate dielectric 72A, a first gate electrode 74A and a first gate cap 76A and a second gate stack of a second gate dielectric 72B, a second gate electrode 74B and a second gate cap 76B are first formed in the p-type and n-type device regions, respectively. The first gate stack (72A, 74A, 76A) and the second gate stack (72B, 74B, 76B) can be formed by first providing a material stack (not shown) that includes, from bottom to top, a gate dielectric layer, a gate electrode layer and a gate cap layer over the (100) silicon layer 30, the light-emitting element 40 and the isolation regions 70.

The gate dielectric layer may include an oxide, nitride or oxynitride. For example, the gate dielectric layer may include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed. The gate dielectric layer can be formed by any deposition technique including, for example, chemical vapor deposition (CVD), plasma enhanced chemical vapor deposition (PECVD), physical vapor deposition (PVD) or atomic layer deposition (ALD). Alternatively, the gate dielectric layer can also be formed by a thermal growth process such as, for example, oxidation, nitridation or oxynitridation to convert a surface portion of the (100) silicon layer 30 into a dielectric material. The gate dielectric layer that is formed can have a thickness ranging from 0.5 nm to 10 nm, with a thickness from 0.5 nm to about 3 nm being more typical.

The gate electrode layer may include any conductive material including, for example, doped polysilicon, an elemental metal such as W, Ti, Ta, Al, Ni, Ru, Pd and Pt, an alloy of at least two elemental metals, a metal nitride such as WN and TiN, a metal silicide such as WSi, NiSi, and TiSi or multilayered combinations thereof. The gate electrode layer can be formed utilizing a deposition process including, for example, CVD, PECVD, PVD or ALD. In embodiments in which polysilicon or SiGe are used as the gate electrode material, an in-situ deposition process can be used or alternatively deposition followed by ion implantation can be used. The gate electrode layer that is formed can have a thickness ranging from 50 nm to 200 nm, although lesser or greater thicknesses can also be employed.

The gate cap layer may include an oxide, nitride or oxynitride. In one embodiment of the present application, the gate cap layer includes silicon nitride. The gate cap layer can be formed by a deposition process including, for example, CVD, PECVD, PVD or ALD. The gate cap layer that is formed can have a thickness ranging from 25 nm to 100 nm, although lesser or greater thicknesses can also be employed.

The material stack is then patterned to form the first gate stack (72A, 74A, 76A) and the second gate stack (72B, 74B, 76B). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. A portion of the gate dielectric layer that remains in the p-type device region constitutes the first gate dielectric 72A, while a portion of the gate dielectric layer that remains in the n-type device region constitutes the second gate dielectric 72B. A portion of the gate electrode layer that remains in the p-type device region constitutes the first gate electrode 74A, while a portion of the gate electrode layer that remains in the n-type device region constitutes the second gate electrode 74B. A portion of the gate cap layer that remains in the p-type device region constitutes the first gate cap 76A, while a portion of the gate cap layer that remains in the n-type device region constitutes the second gate cap 76B. After formation of the first and the second gate stacks (72A, 74A, 76A & 72B, 74B, 76B), the patterned photoresist layer is removed by, for example, ashing.

In one embodiment, the first and the second gate stacks (72A, 74A, 76A & 72B, 74B, 76B) can be sacrificial gate stacks that are subsequently removed, and replaced with functional gate stacks each including a functional gate dielectric, a functional gate electrode and a functional gate cap after forming source and drain regions for FETs.

Following the formation of the first and the second gate stacks (72A, 74A, 76A & 72B, 74B, 76B), a first gate spacer 78A is formed on sidewalls of the first gate stack (72A, 74A, 76A), while a second gate spacer 78B is formed on sidewalls of the second gate stack (72B, 74B, 76B). Each of the first and the second gate spacers 78A, 78B may include a dielectric material such as, for example, an oxide, a nitride, an oxynitride, or any combination thereof. In one embodiment, each of the first and the second gate spacers 78A, 78B is composed of silicon nitride. The first and the second gate spacers 78A, 78B can be formed by first providing a conformal gate spacer material layer (not shown) on exposed surfaces of the first and the second gate stacks (72A, 74A, 76A & 72B, 74B, 76B), the light-emitting element 40, the isolation regions 70 and the (100) silicon layer 30 and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. A portion of the gate spacer material layer that remains on the sidewalls of the first gate stack (72A, 74A, 76A) constitutes the first gate spacer 78A, while a portion of the gate spacer material layer that remains on the sidewalls of the second gate stack (72B, 74B, 76B) constitutes the first gate spacer 78A. The width of each of the first and the second gate spacers 78A, 78B, as measured at the base of the gate spacer 28 can be from 5 nm to 100 nm, although lesser and greater widths can also be employed.

The first gate stack (72A, 74A, 76A) and the first gate spacer 78A present on the sidewalls of the first gate stack (72A, 74A, 76A) together define a first gate structure for a p-type FET subsequently formed. The second gate stack (72B, 74B, 76B) and the second gate spacer 78B present on the sidewalls of the second gate stack (72B, 74B, 76B) together define a second gate structure for an n-type FET subsequently formed.

A first source region and a first drain region (collectively referred to as first source/drain regions 82A) are formed in portions of the (100) silicon layer 30 located on opposite sides of the first gate stack (72A, 74A, 76A), while a second source region and a second drain region (collectively referred to as second source/drain regions 82B) are formed in portions of the (100) silicon layer 30 located on opposite sides of the second gate stack (72B, 74B, 76B). The first source/drain regions 82A and the second source/drain regions 82B can be formed by ion implantation. Block masks may be employed to select the portions of the (100) silicon layer 30 where the first source/drain regions 82A and the second source/drain regions 82B are to be formed. For example, when forming the first source/drain regions 82A by ion implantation of p-type dopants, a block mask (not shown) may be formed to cover the n-type device region and the light-emitting element 40. When forming the second source/drain regions 82B by ion implantation of n-type dopants, a block mask (not shown) may be formed to cover the p-type device region and the light-emitting element 40. The doping concentration of the p-type dopants in the p-type device region or the n-type dopants in the n-type device region may range from $1 \times 10^{17}$ atoms/cm$^3$ to $1 \times 10^{19}$ atoms/cm$^3$.

An undoped portion of the (100) silicon layer 30 located beneath the first gate stack (72A, 74A, 76A) and between the first source/drain regions 72A constitutes a first channel region 84A for a p-type FET. A portion of the (100) silicon layer 30 located beneath the second gate stack (72B, 74B, 76B) and between the second source/drain regions 72B constitutes a second channel region 84B for an n-type FET.

A p-type FET 100A is thus formed in the p-type device region. The p-type FET 100A includes a first channel region 84A, first source/drain regions 82A laterally surrounding the first channel region 84A, and a first gate structure including a first gate stack (72A, 74A, 76A) located over the first channel region 84A and a first gate spacer 78A present on sidewalls of the first gate sack (72A, 74A, 76A).

An n-type FET 100B is thus formed in the n-type device region. The n-type FET 100B includes a second channel region 84B, second source/drain regions 82B laterally surrounding the second channel region 84B, and a second gate structure including a second gate stack (72B, 74B, 76B) located over the second channel region 74B and a second gate spacer 78B present on sidewalls of the second gate sack (72B, 74B, 76B).

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a semiconductor-on-insulator (SOI) substrate including, from bottom to top, a (111) silicon layer, a buried insulator layer and a (100) silicon layer;
   a field effect transistor (FET) located on a portion of the (100) silicon layer;
   a light-emitting element separated from the FET and embedded in the SOI substrate, wherein the light-emitting element is laterally surrounded by the (100) silicon layer, the buried insulator layer and an upper portion of the (111) silicon layer; and
   a patterned portion of the (111) silicon layer located beneath the light-emitting element, the patterned portion of the (111) silicon layer comprising trenches exposing portions of a bottommost surface of the light-emitting element.

2. The semiconductor structure of claim 1, wherein a topmost surface of the light-emitting element is coplanar with a top surface of the (100) silicon layer.

3. The semiconductor structure of claim 2, wherein the light-emitting element comprises, from bottom to top, a first contact layer, a light-emitting layer and a second contact layer, wherein a top surface of the second contact layer is coplanar with the top surface of the (100) silicon layer.

4. The semiconductor structure of claim 3, wherein each of the first contact layer, the light-emitting layer and the second contact layer has a (111) crystallographic surface orientation.

5. The semiconductor structure of claim 3, wherein the first contact layer comprises an n-doped III-V compound semiconductor material, and the second contact layer comprises a p-doped III-V compound semiconductor material.

6. The semiconductor structure of claim 5, wherein the first contact layer comprises Si-doped GaN or Si-doped AlN, and the second contact layer comprises Mg-doped GaN, Mg-doped AlN, Zn-doped GaN, or Zn-doped AlN.

7. The semiconductor structure of claim 3, wherein the light-emitting layer comprises alternating layers of a first III-V compound semiconductor material and a second III-V compound semiconductor material having a bandgap narrower than the first III-V compound semiconductor material.

8. The semiconductor structure of claim 7, wherein the light-emitting layer comprises alternating layers of GaN and AlGaN or alternating layers of GaN and InGaN.

9. The semiconductor structure of claim 1, wherein the FET comprises a gate structure located over a channel region and source/drain regions and laterally surrounding the channel region, wherein the channel region and the source/drain regions are located within the (100) silicon layer.

10. The semiconductor structure of claim 9, further comprising another FET located on another portion of the (100) silicon layer, wherein the another FET comprises another gate structure located over another channel region located within the (100) silicon layer and another source/drain regions located within the (100) silicon layer and laterally surrounding the another channel region, wherein the another source/drain regions comprises dopant having a conductivity type opposite a conductivity type of dopants in the source/drain regions.

11. A method of forming a semiconductor structure comprising:
    forming an opening extending through a (100) silicon layer, a buried insulator layer and into an upper portion of a (110) silicon layer of a semiconductor-on-insulator (SOI) substrate;
    forming a light-emitting element within the opening, the light-emitting element having a topmost surface coplanar with a top surface of the (100) silicon layer;
    patterning a portion of the (111) silicon layer located beneath the light-emitting element; and
    forming a field effect transistor (FET) in a region of the (100) silicon layer.

12. The method of claim 11, wherein the opening exposes a sub-surface of the (111) silicon layer that is located below a top surface of the (111) silicon layer.

13. The method of claim 12, wherein the forming the light-emitting element comprises:
    forming a first contact layer on the sub-surface of the (111) silicon layer;
    forming a light-emitting layer on the first contact layer; and
    forming a second contact layer on the light-emitting layer.

14. The method of claim 13, wherein each of the first contact layer, the light-emitting layer and the second contact layer is formed by a selective epitaxial growth.

15. The method of claim 13, further comprising forming a first contact structure contacting the first contact layer and forming a second contact structure contacting the second contact layer.

16. The method of claim 11, wherein the portion of the (111) silicon layer located beneath the light-emitting element is patterned to form a patterned structure comprising features and trenches separating the features from one another.

17. The method of claim 16, wherein the trenches exposes portions of a bottommost surface of the light-emitting element.

18. The method of claim 11, wherein the forming the FET in the region of the (100) silicon layer comprises:
    forming a gate stack over a portion of the (100) silicon layer;
    forming a gate spacer on sidewalls of the gate stack; and
    forming source/drain regions in portions of the (100) silicon layer located on opposite sides of the gate stack.

19. The method of claim 18, wherein the gate stack comprises, from bottom to top, a gate dielectric, a gate electrode and a gate cap.

20. The method of claim 18, further comprising forming another FET in another region of the (100) silicon layer, wherein the forming the another FET comprises:
    forming another gate stack over another portion of the (100) silicon layer;
    forming another gate spacer on sidewalls of the another gate stack; and
    forming another source/drain regions in portions of the (100) silicon layer located on opposite sides of the another gate stack, wherein the another source/drain regions comprise dopants having a conductivity type opposite to a conductivity type of dopants in the source/drain regions.

* * * * *